(12) United States Patent
Ye et al.

(10) Patent No.: US 11,503,731 B2
(45) Date of Patent: Nov. 15, 2022

(54) ASSEMBLY STRUCTURE AND ELECTRONIC DEVICE HAVING THE SAME

(71) Applicant: Delta Electronics,Inc., Taiwan (CN)

(72) Inventors: Haoyi Ye, Taiwan (CN); Jianhong Zeng, Taiwan (CN); Yu Zhang, Taiwan (CN); Peiqing Hu, Taiwan (CN); Ziying Zhou, Taiwan (CN)

(73) Assignee: Delta Electronics Inc., Taoyuan (CN)

( * ) Notice: Subject to any disclaimer, the term of this patent is extended or adjusted under 35 U.S.C. 154(b) by 148 days.

(21) Appl. No.: 17/004,194

(22) Filed: Aug. 27, 2020

(65) Prior Publication Data

US 2020/0396855 A1    Dec. 17, 2020

Related U.S. Application Data

(63) Continuation of application No. 15/164,214, filed on May 25, 2016, now abandoned.

(30) Foreign Application Priority Data

Jun. 26, 2015 (CN) .......................... 201510362342.2

(51) Int. Cl.
*H05K 7/02* (2006.01)
*H05K 7/10* (2006.01)
(Continued)

(52) U.S. Cl.
CPC .............. *H05K 7/02* (2013.01); *G06F 1/188* (2013.01); *G06F 1/20* (2013.01); *H05K 1/0218* (2013.01); *H05K 1/0262* (2013.01); *H05K 1/141* (2013.01); *H05K 1/181* (2013.01); *H05K 1/182* (2013.01); *H05K 7/10* (2013.01); *H05K 7/2039* (2013.01); *H01L 25/165* (2013.01); *H05K 3/368* (2013.01);
(Continued)

(58) Field of Classification Search
None
See application file for complete search history.

(56) References Cited

U.S. PATENT DOCUMENTS 8,379,400 B2 * 2/2013 Sunohara .......... H01L 23/49827
361/783
8,982,563 B2 * 3/2015 Raj ...................... H05K 7/1092
361/721

(Continued)

*Primary Examiner* — James Wu
*Assistant Examiner* — Christopher L Augustin
(74) *Attorney, Agent, or Firm* — Qinghong Xu

(57) ABSTRACT

The present disclosure provides an assembly structure for providing power for a chip and an electronic device using the same. The assembly structure includes: a circuit board, configured to provide a first electrical energy; a chip; a power converting module, configured to electrically connect the circuit board and the chip, convert the first electrical energy to a second electrical energy, and supply the second electrical energy to the chip, wherein the chip, the circuit board and the power converting module are stacked; and a connection component, configured to electrically connect the circuit board and the power converting module. The present disclosure assembles a power converting module with a circuit board and a chip in a stacking manner, which may shorten a current path between the power converting module and the chip, reduce current transmission losses, improve efficiency of a system, reduce space occupancy and save system resource.

13 Claims, 49 Drawing Sheets

(51) Int. Cl.
  *H05K 1/14* (2006.01)
  *H05K 1/02* (2006.01)
  *G06F 1/20* (2006.01)
  *G06F 1/18* (2006.01)
  *H05K 1/18* (2006.01)
  *H05K 7/20* (2006.01)
  *H05K 3/36* (2006.01)
  *H01L 25/16* (2006.01)

(52) U.S. Cl.
  CPC ......... *H05K 2201/1053* (2013.01); *H05K 2201/10189* (2013.01); *H05K 2201/10325* (2013.01); *H05K 2201/10515* (2013.01); *H05K 2201/10545* (2013.01)

(56) References Cited

U.S. PATENT DOCUMENTS

| | | | |
|---|---|---|---|
| 2006/0055432 A1* | 3/2006 | Shimokawa | H01L 21/565 257/E23.125 |
| 2006/0109623 A1* | 5/2006 | Harris | H05K 1/141 257/E23.099 |
| 2006/0126297 A1* | 6/2006 | Belady | H05K 1/141 257/E23.102 |
| 2006/0181857 A1* | 8/2006 | Belady | H05K 1/141 257/E23.099 |
| 2006/0187646 A1* | 8/2006 | Belson | H05K 1/141 361/719 |
| 2007/0013080 A1* | 1/2007 | DiBene | H01L 25/0652 257/E25.011 |
| 2008/0117593 A1* | 5/2008 | Andric | H01L 23/467 257/E23.099 |
| 2009/0296360 A1* | 12/2009 | Doblar | H05K 7/1061 361/767 |
| 2010/0102327 A1* | 4/2010 | Standing | H01L 25/072 257/213 |
| 2012/0025298 A1* | 2/2012 | Ho | H01L 23/4824 257/329 |
| 2013/0221537 A1* | 8/2013 | Fu | H01L 23/49827 257/774 |
| 2015/0223320 A1* | 8/2015 | Gerhauer | H01L 23/5389 29/832 |

* cited by examiner

ASSEMBLY STRUCTURE AND ELECTRONIC DEVICE HAVING THE SAME

CROSS-REFERENCE TO RELATED APPLICATIONS

This application is a Continuation of U.S. application Ser. No. 15/164,214, filed on May 25, 2016, which is based upon and claims priority to Chinese Patent Application No. 201510362342.2, filed Jun. 26, 2015, the entire contents of which are incorporated herein by reference.

TECHNICAL FIELD

The present disclosure relates to an assembly structure and an electronic device, and more particularly, to an assembly structure for providing power for a chip and an electronic device having the assembly structure.

BACKGROUND

With growth of demand for intelligent life of people, demand for data processing is also growing. Throughout the world, power consumption spent on data processing has reached hundreds of billions of or even trillions of kilowatts-hours each year on average, and a large data center may occupy an area up to tens of thousands of square meters. Accordingly, high efficiency and high power density are key pointers of healthy development of a data center.

Key units of a data center are servers, each of which is typically equipped with a main board composed of data processing chips (such as a CPU, chipsets, a memory or the like), their power supply modules and necessary peripheral components. With increase of processing capacity per volume unit of a server, the amount and integration level of the processing chips are also increasing, resulting in increase of space occupancy and power consumption. Accordingly, the power supply module (also referred to as a main board power supply module since it is provided on the same main board with the data processing chips) for the chips is expected to have higher efficiency, higher power density and smaller volume than before, to realize energy saving and reduction of area occupancy for the entire server or even for the entire data center. Along with increase of computing speeds of chips, power consumption of the chips increases. Although supply voltages of the chips trend to be reduced, supply currents are still increased greatly due to increase of amount of transistors, which causes that losses on a current path from the power source modules to the chips increase greatly and whole efficiency of systems are reduced.

FIG. 1A is a schematic diagram of a chip installing mode and a power supply mode in prior art. A main board 11 of a server is provided with a processor chip 12 (for example, a central processing unit (CPU), a graphics processor unit (GPU), and a data communication switch chip or other large scale integrated circuit chips and the like, here the processor chip in FIG. 1A takes the CPU as an example) and a power supply module 13 (for example, a DC (direct current)/DC module). In addition, the processor chip 12 is provided thereon with a heat sink 14 for dissipating heat it produces. Since the processor chip 12 is usually a very sophisticated device, which has a plurality of pins, even up to 2000 or more, to ensure reliable connections between all pins and the system, an additional member (for example, a socket 15, a CPU clip 16, a support plate 17, a back plate 18 and a screw 19 and the like in FIG. 1A) is usually needed to fix the processor chip 12 to the main board 11. In addition, a capacitor 111 is further provided between the processor chip 12 and the power supply module 13 on the main board 11. Such structural members occupy much space around the chip 12, so that the power supply module 13 cannot be close to the processor chip 12, which results in a long current path and more losses. In some applications, the losses may even reach 2% of total power consumption of the chip.

FIG. 1B is another schematic diagram of a chip installing mode and a power supply mode in the prior art. Body heights of some processor chips 12 with high energy consumption are very low and relatively large heat sinks 14 are provided. Heights of the power supply modules are hard to be lower than the body heights of the chips. Limited by sizes of the heat sinks, the power supply modules cannot be placed in positions close to the chips, which results in long current paths and more losses.

SUMMARY OF THE DISCLOSURE

One aspect of the present disclosure provides an assembly structure, including:

a circuit board, configured to provide a first electrical energy;

a chip;

a power converting module, configured to electrically connect the circuit board and the chip, convert the first electrical energy to a second electrical energy, and supply the second electrical energy to the chip, wherein the chip, the circuit board and the power converting module are stacked; and a connection component, configured to electrically connect the circuit board and the power converting module.

The present disclosure assembles a power converting module with a circuit board and a chip in a stacking manner, which may shorten a current path between the power converting module and the chip.

DETAILED DESCRIPTION

Figure 1A:
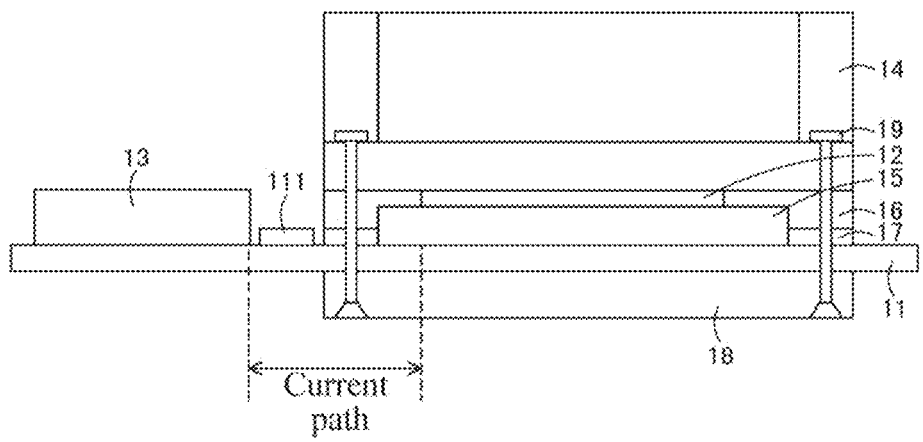
FIGS. 1A and 1B are schematic diagrams of an assembly structure for providing power for a chip in the prior art.
Figure 1B:
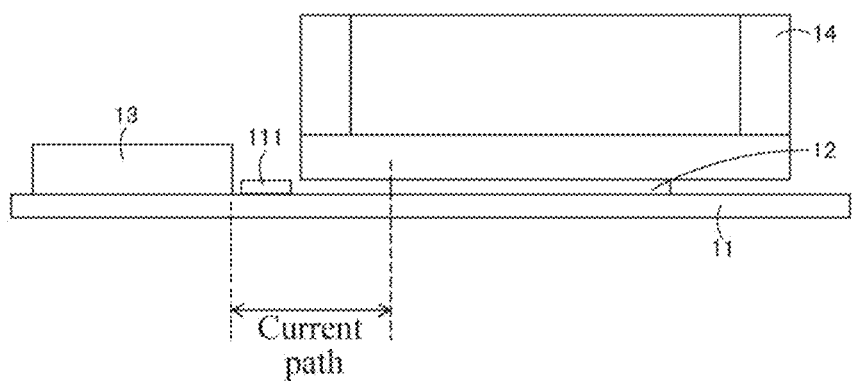
Figure 2:
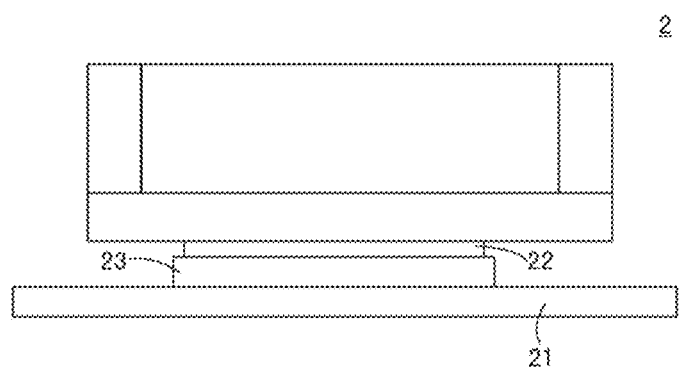
FIG. 2 is a schematic diagram of an assembly structure for providing power for a chip in which a power converting module and a chip are located in the same side of a circuit board, according to an embodiment of the present disclosure.

FIG. 2 is a schematic diagram of an assembly structure for providing power for a chip of an embodiment of the present disclosure. The assembly structure 2 for providing power for a chip includes a circuit board 21, which provides a first electrical energy; a chip 22, which may be a CPU, a GPU or a memory and the like; and a power converting module 23, which is electrically connected to the circuit board 21 and the chip 22, converts the first electrical energy to a second electrical energy, and supplies the second electrical energy to the chip 22. Wherein the power converting module 23 may be located between the chip 22 and the circuit board 21 and they are mutually stacked to form the assembly structure 2. However, the present disclosure is not limited to this. An upper surface of the power converting module 23 and a lower surface of the chip 22 may be contacted and electrically connected. A lower surface of the power converting module 23 and an upper surface of the circuit board 21 may be contacted and electrically connected. A connecting mode between the power converting module 23 and the chip 22 may be welding or pressing, etc. In the present embodiment, the power converting module 23 is disposed below the chip 22 and the power converting module 23 directly contacts and electrically connects the chip 22, which shortens the current path between the power source conversion module 23 and the chip 22, reduces current transmission losses, lowers area occupancy of components on the circuit board 21, and saves space of the whole system.

Figure 2A:
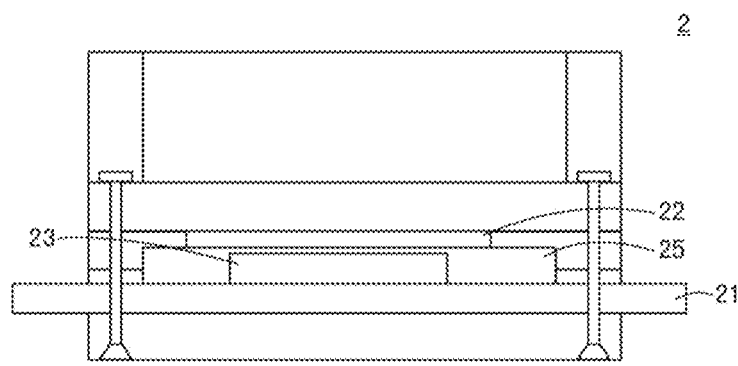
FIG. 2A is a schematic diagram of an assembly structure for providing power for a chip in which a power converting module is partly buried in a socket and directly contacts a circuit board, according to an embodiment of the present disclosure.

FIG. 2A is a schematic diagram of an assembly structure for providing power for a chip of another embodiment of the present disclosure. Main differences between the assembly structure 2 for providing power for a chip in the present embodiment and that of the above embodiment lie in that, it further includes a socket 25. The chip 22 is electrically connected to the socket 25, the power converting module 23 may be partly buried in the socket 25, a lower surface of the power converting module 23 may be exposed from the socket 25, and the lower surface of the power converting module 23 may contact an upper surface of the circuit board 21. The power converting module 23 may be electrically connected to the socket 25. In one embodiment, the power converting module 23 may provide the second electrical energy for the chip 22 at least partly through the socket 25. The power converting module 23 and the socket 25 may be two separate components to be assembled together, or may be integrated into an undetachable component through molding technology or embedding technology used in packaging. The present disclosure is not limited to this.

Figure 2B:
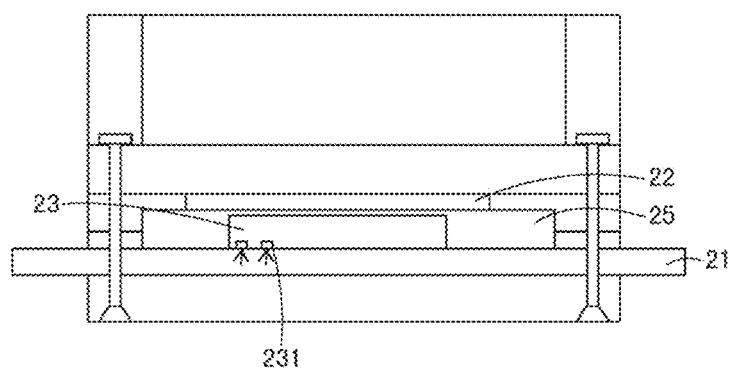
FIGS. 2B-2C are schematic diagrams of an assembly structure for providing power for the chip of FIG. 2A in which the power converting module and the circuit board are connected through pins.
Figure 2C:
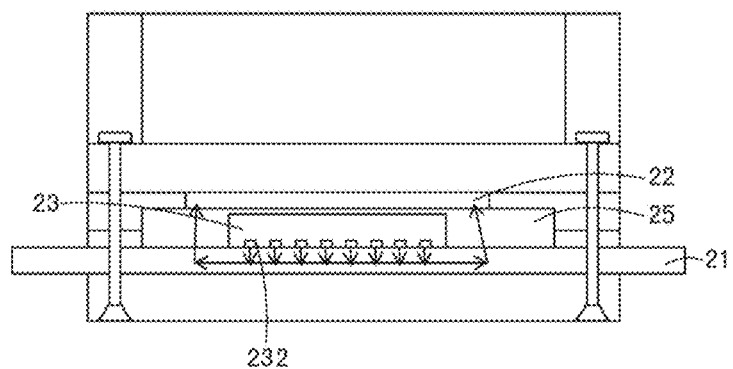

The power converting module 23 includes an input and an output. The input of the power converting module 23 may include power input or a signal input of the power converting module 23, or include both. As shown in FIG. 2B, input pins 231 provided on the lower surface of the power converting module 23 electrically connect the circuit board 21. The power input and/or signal input may be directly transmitted to the power converting module 23 from the circuit board 21, as shown by arrows in FIG. 2B. As shown in FIG. 2C, output pins 232 provided on the lower surface of the power converting module 23 electrically connect the circuit board 21, and they may further connect the chip 22 through the circuit board 21 and the socket 25. A power output and/or signal output may be transmitted from the power converting module 23 to the chip 22 through the circuit board 21 and the socket 25 in sequence. However, the present disclosure is not limited to this. For example, the power output and/or signal output may be transmitted from the power converting module 23 to the chip 22 through the socket 25, or may be directly transmitted to the chip 22, and so on. A connecting mode between the pins 231 and 232 and the circuit board 21 may be welding or pressing, etc. The present disclosure is not limited to this.

Figure 2D:
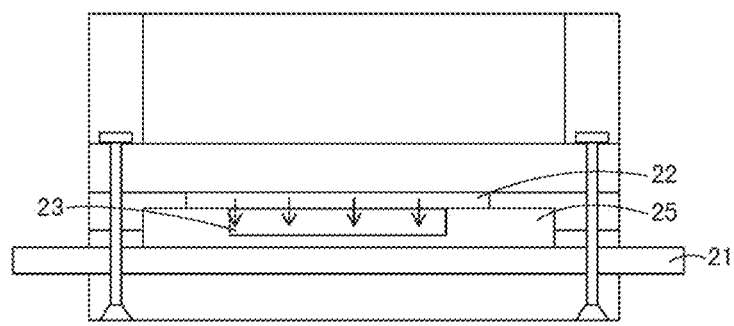
FIGS. 2D-2E are schematic diagrams of an assembly structure for providing power for a chip in which a power converting module is partly buried in a socket and directly contacts a chip, according to an embodiment of the present disclosure.
Figure 2E:
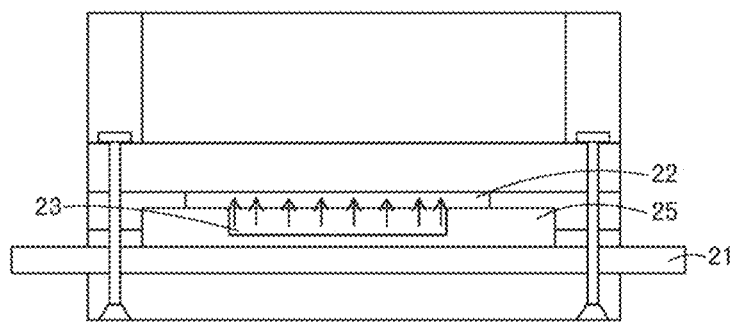

FIG. 2D is a schematic diagram of an assembly structure for providing power for a chip of another embodiment of the present disclosure. It mainly differs from the embodiments as shown in FIGS. 2A-2C in that, the power converting module 23 is partly buried in the socket 25, an upper surface of the power converting module 23 is exposed from the socket 25, and the upper surface of the power converting module 23 contacts a lower surface of the chip 22. The power converting module 23 may directly provide the second electrical energy for the chip 22. Because the upper surface of the power converting module 23 may directly contact the lower surface of the chip 22, an input and an output of the power converting module 23 may be directly connected with the chip 22. Combining with FIG. 2E, power and/or signals may be transmitted between the chip 22 and the power converting module 23, wherein a transmission direction of the power and/or signals may be as shown by the arrows in FIG. 2E. Set positions of the pins electrically connecting the power converting module 23 and the chip 22, connecting mode between the pins and the chip, and structure of the pins may be the same as illustrated in the embodiments as shown in FIGS. 2A-2C, which will not be repeated here, but the present disclosure is not limited to this.

Figure 2F:
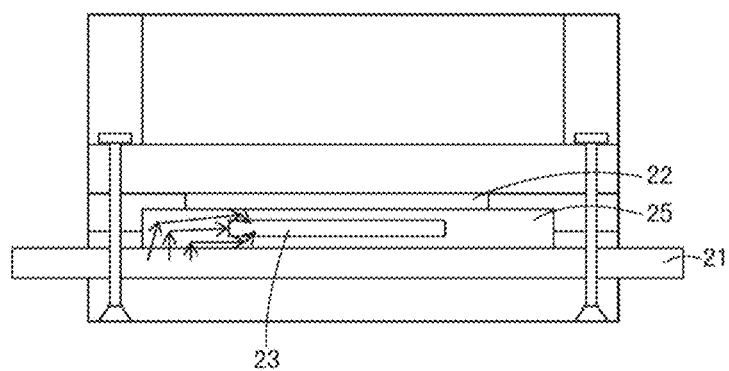
FIGS. 2F-2G are schematic diagrams of an assembly structure for providing power for a chip in which a power converting module is entirely buried in a socket, according to a further embodiment of the present disclosure.
Figure 2G:
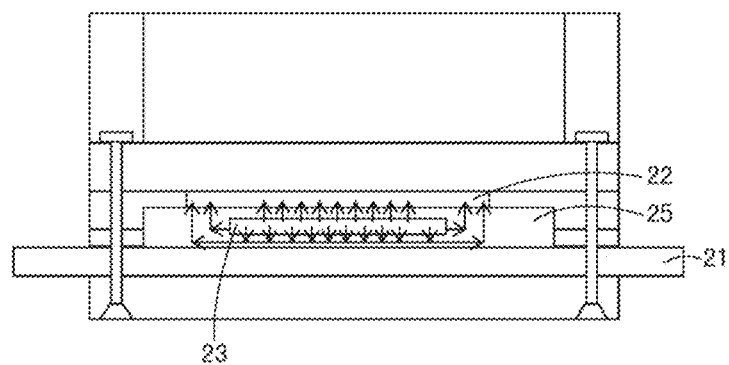

FIG. 2F is a schematic diagram of an assembly structure for providing power for a chip of a further embodiment of the present disclosure. It mainly differs from the embodiments as shown in FIGS. 2A-2E where the power converting module 23 is partly buried in the socket 25 in that, in the present embodiment, the power converting module 23 is entirely buried in the socket 25. The power converting module 23 is electrically connected to the socket 25. The power converting module 23 provides the second electrical energy for the chip 22 through the socket 25. An input of the power converting module 23 may connect the circuit board 22 through the socket 25. Input power and/or signals are transmitted from the circuit board 21 to the socket 25, and then transmitted to the power converting module 23 through the socket 25. Connections of the input power and/or signals between the power converting module 23 and the socket 25 may be on a side surface, an upper surface or a lower surface of the power converting module 23, or may be on a plurality of surfaces, which is shown by the arrows in FIG. 2F. However, the present disclosure is not limited to this. As shown in FIG. 2G an output of the power converting module 23 may connect the chip 22 through the socket 25. Output power and/or signals are transmitted from the power converting module 23 to the socket 25, and then transmitted to the chip 22 through the socket 25. Connections of the power output and/or signal output between the power converting module 23 and the socket 25 may be on a side surface, an upper surface or a lower surface of the power converting module 23, or may be on a plurality of surfaces, which is shown by the arrows in FIG. 2G. However, the present disclosure is not limited to this. The power converting module 23 and the socket 25 may be integrated into an undetachable entirety, or the power converting module 23 and the socket 25 may be detachable components. When the power converting module 23 and the socket 25 are integrated into an entirety, the connections between the power converting module 23 and the socket 25 may be realized via conductors inside. While when the power converting module 23 and the socket 25 are detachable components, a connecting mode between the power converting module 23 and the socket 25 may adopt ways such as welding or pressing.

Figure 3A:
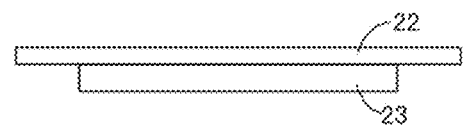
FIGS. 3A-3C are schematic diagrams of a distribution of pins between a power converting module and a chip in an assembly structure, according to an embodiment of the present disclosure.
Figure 3B:
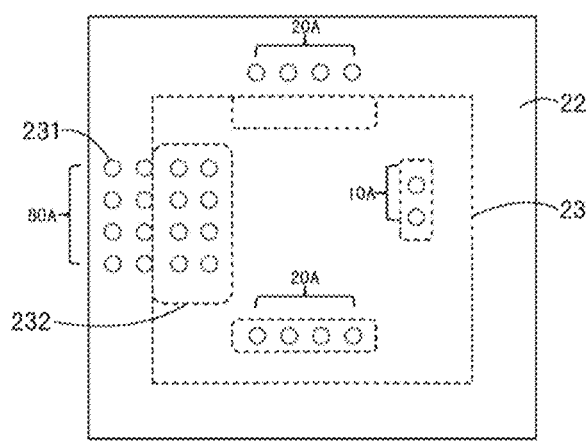

An arrangement of output pins of the power converting module 23 may be determined according to corresponding pin positions of the chip 22, the socket 25 or the circuit board 21, to realize a shorter power and/or signal transmitting distance. FIGS. 3A and 3B are schematic diagrams of pin arrangements when the power converting module 23 directly connects the chip 22, wherein FIG. 3A is a side view and FIG. 3B is a plan view. Power input pins 231 (or electrical energy input terminals) of the chip 22 are denoted by dashed circles, which may be distributed in different regions of surfaces of the chip 22. Power received by respective regions may be different, which is denoted by current values in FIG. 3B. Power output pins 232 (denoted by dashed boxes in FIG. 3B) of the power converting module 23 may be arranged according to positions of the power input pins of the chips, distributed on surfaces of the power converting module 23. For example, projections of the power output pins 232 of the power converting module 23 and projections of the power input pins of the chip 22 in a direction perpendicular to the circuit board, may be overlapped. The present disclosure is not limited to this. The chip 22 and the power converting module 23 may use pins with different shapes, sizes, and/or materials according to power demand of regions where the pins are located, to realize the aim of reducing power transmission losses. Respective regions of surfaces of the power converting module 23 may have one or more pins. A surface for electrical connection may be referred to as an electrical connecting surface. For example, the upper surface of the power converting module 23 may be referred to as a first electrical connecting surface, the lower surface of the chip 22 may be referred to as a second electrical connecting surface. However, the present disclosure is not limited to this. In one embodiment, the chip has at least one electrical energy input terminal, which may be provided on the lower surface or other positions of the chip. The power output terminals of the power converting module 23 may be provided on the upper surface or other positions of the power converting module 23. Projection of the electrical energy input terminal of the chip and projection of the power output terminal of the power converting module in a direction perpendicular to the circuit board, may be overlapped, to further reduce current path length. However, the present disclosure is not limited to this.

Figure 3C:
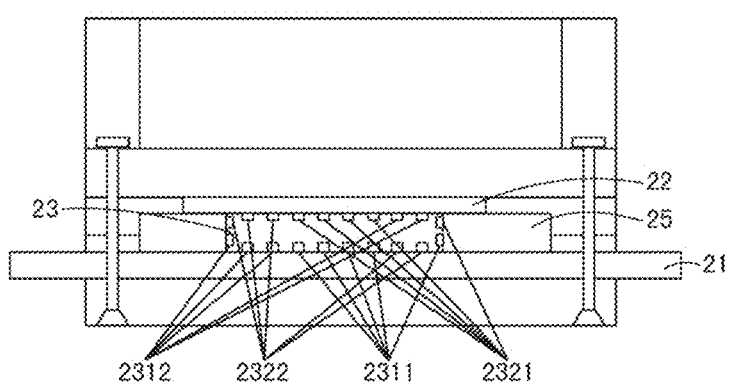
Figure 4A:
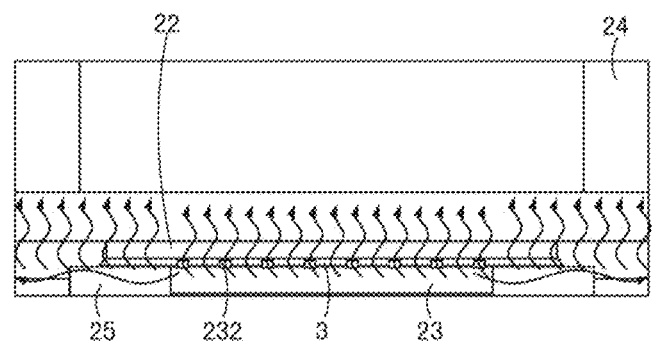
FIGS. 4A-4B are schematic diagrams of heat dissipation of the assembly structure for providing power for the chip of embodiments as shown in FIGS. 2A-2E.
Figure 4B:
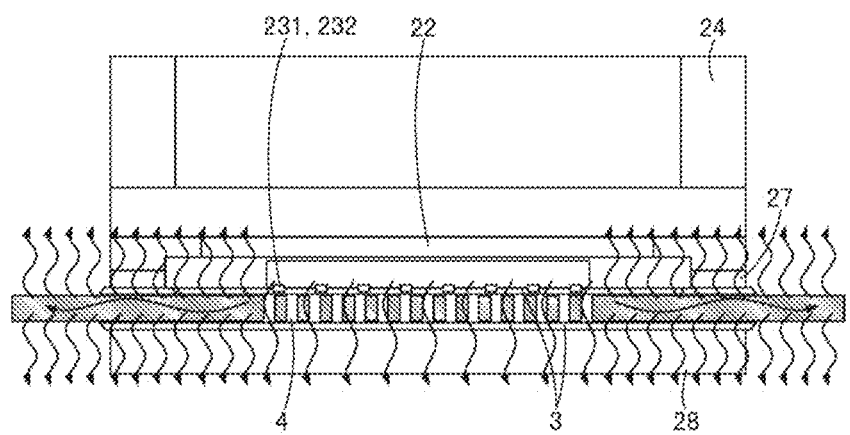

Combining with FIGS. 4A and 4B, input pins 231 and output pins 232 of the power converting module 23 may be located on the same surface (for example, a top surface or a bottom surface) or different surfaces of the power converting module 23. Alternatively, the input pins 231 and output pins 232 of the power converting module 23 may be partly located on the same surface or partly located on different surfaces of the power converting module 23. The present disclosure is not limited to this. The input pins 231 and output pins 232 of the power converting module 23 may adopt the same connecting mode or different connecting modes to connect the circuit board 21 and the chip 22. For example, in FIG. 3C, a part of power input pins 2311 (for example, input positive Vin+, input negative Vin−, auxiliary power supply and the like), a part of signal input pins 2312 (for example, input voltage sampling, input current sampling and the like), and a part of signal output pins 2322 (for example, an overcurrent warning signal, a module overheat warning signal and the like) of the power converting module 23 may be located on the bottom surface of the power converting module 23 and connected with the circuit board 21. A part of power output pins 2321 (for example, output positive Vo+, output negative Vo− and the like), a part of signal output pins 2322 (for example, an input current monitoring signal, an output current monitoring signal and the like), and a part of signal input pins 2312 (for example, a terminal voltage sampling signal of the chip and the like) may be located on the top surface of the power converting module 23 and connected with the chip 22. A part of power input pins 2311 (for example, the input positive Vin+, the input negative Vin−, the auxiliary power supply and the like), a part of power output pins 2321 (for example, the output positive Vo+, the output negative Vo− and the like), a part of signal input pins 2312 (for example, a digital communication input and the like) and a part of signal output pins 2322 (for example, a digital communication output and the like) may be alternatively located on a side surface of the power converting module 23 and connected with the socket 25.

In the above embodiments, the chip 22 is equipped with a heat sink 24, but the present disclosure is not limited to this. For example, the heat sink may not only contact the chip, but also directly contact the power converting module 23, to dissipate heat from the power converting module 23. FIGS. 4A and 4B are schematic diagrams of heat dissipation of the assembly structure for providing power for a chip of the above embodiments. As shown in FIG. 4A, the heat may be conducted from the power converting module 23 to the chip 22 through a connection between the power converting module 23 and the chip 22, or it may be laterally conducted through the socket 25 and then conducted upwards. In order to conduct the heat of the power converting module 23 to surrounding elements more smoothly, heat conductive material may be filled in gaps between the power converting module 23 and the surrounding elements or gaps between respective adjacent parts. As shown in FIG. 4A, heat conductive material 3 is directly filled between the power converting module 23 and the chip 22, and between the socket 25 and the chip 22. The heat may be conducted from the power converting module 23 or the socket 25 to the chip 22 through the heat conductive material 3, and then conducted to the heat sink 24 through the chip 22. As long as heat conductivity coefficient of the filled material is better than that of the air, it may facilitate heat conducting from the power converting module 23 to the surrounding elements.

Heat of the power converting module 23 may be dissipated by being laterally conducted to other regions through the circuit board 21. For example, the heat may be conducted to the support plate 27 through the circuit board 21 and then dissipated by the support plate 27. As shown in FIG. 4B, heat of the power converting module 23 may be conducted to a lower surface of the circuit board 21 in a vertical direction through a thermal via 4, and then dissipated by the heat sink or a back plate 28 provided below. In order to conduct the heat of the power converting module 23 to the circuit board 21 and the surrounding elements more smoothly, heat conductive material may be filled in gaps between the power converting module 23 and the circuit board 21, gaps between the circuit plate 21 and the surrounding elements or gaps between respective adjacent elements. Heat dissipation of the power converting module 23 may be realized by a combined mode as shown in FIGS. 4A and 4B or other modes. The present disclosure is not limited to this.

Figure 5:
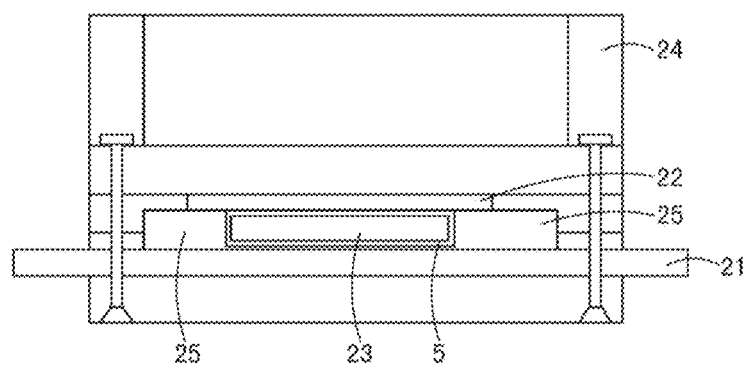
FIG. 5 is a schematic diagram of an assembly structure for providing power for a chip of an embodiment of the present disclosure which includes an electromagenetic shielding layer.

FIG. 5 is a schematic diagram of an assembly structure for providing power for a chip of an embodiment of the present disclosure which includes an electromagnetic shielding layer 5. Electromagnetic fields generated by power conversion exist around the power converting module 23. If handled improperly, the electromagnetic fields will couple to the chip 22 nearby and/or peripheral circuits of the chip 22, resulting in wrong operations of the chip 22. This phenomenon is called electromagnetic interference (EMI). In order to prevent EMI, the electromagnetic shielding layer 5 may be installed around the power converting module 23. If needed, the electromagnetic shielding layer 5 may be provided on one surface or a plurality of surfaces of the power converting module 23, wherein the electromagnetic shielding layer on any surface may cover the surface entirely (overall shielding) or cover the surface partially (shadow shielding). At least a part of the electromagnetic shielding layer 5 may be located between the chip 22 and the power converting module 23, and vertically stacked with the power converting module 23 and the chip 22, to reduce or even eliminate mutual interference between the chip 22 and the power converting module 23. Aiming at shielding of different purposes, such as electric shielding or magnetic shielding, material of the shielding layer 5 may be metal material (such as copper, aluminum and the like) or magnetic material (such as soft magnetic material) correspondingly. The shielding layer 5 may be installed as a separate component, or may be integrated together with the power converting module 23 and/or the socket 25, or may be partly separated and partly integrated with other components.

Figure 6:
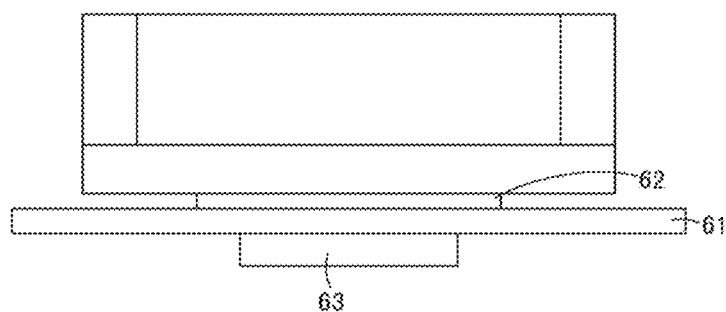
FIG. 6 is a schematic diagram of an assembly structure for providing power for a chip in which a power converting module and a chip are located in different sides of a circuit board, according to an embodiment of the present disclosure.

Stacking modes in the assembly structure for providing power for a chip of the above embodiments are that, the power converting module 23 and the chip 22 are located on the same side of the circuit board 21. FIG. 6 is another stacking mode of the assembly structure for providing power for a chip according to an embodiment of the present disclosure. A power converting module 63 and a chip 62 are respectively located on two opposite sides of a circuit board 61. The power converting module 63 may electrically connect the chip 62 through the circuit board 61. A heat sink (not shown) may be provided to directly contact the power converting module 63.

Figure 6A:
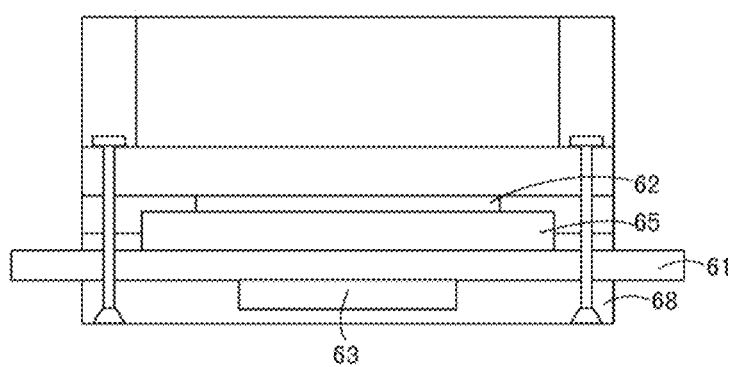
FIG. 6A is a schematic diagram of an assembly structure for providing power for a chip in which a power converting module is partly buried in a back plate and directly contacts a circuit board, according to an embodiment of the present disclosure.

FIG. 6A is a schematic diagram of an assembly structure for providing power for a chip according to another embodiment of the present disclosure. Compared with FIG. 6, the assembly structure for providing power for a chip further includes a socket 65 and a back plate 68. The socket 65 is located between the chip 62 and the circuit board 61, and electrically connects the chip 62 and the circuit board 61. The power converting module 63 may be partly buried in the back plate 68. An upper surface of the power converting module 63 may be exposed from the back plate 68, and the upper surface of the power converting module 63 may contact a lower surface of the circuit board 61. The power converting module 63 and the back plate 68 may be two components to be used separately or by being combined, or they may be integrated into an undetachable component, for example through molding technology or embedding technology used in packaging to bury the power converting module 63 in the back plate 68. The present disclosure is not limited to this.

Figure 6B:
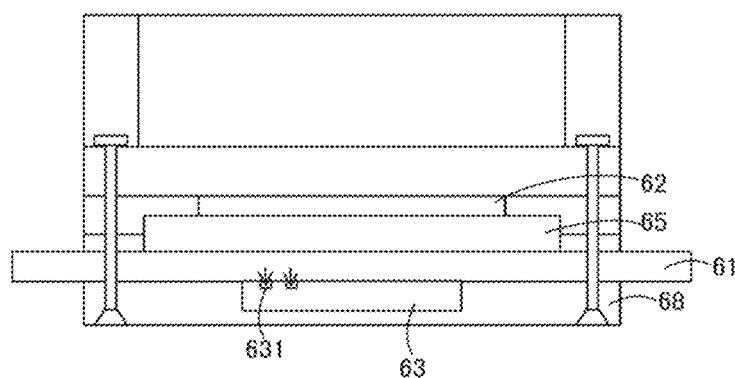
FIGS. 6B-6C are schematic diagrams of an assembly structure for providing power for a chip of FIG. 6A in which a power converting module and a circuit board are connected through a pin.
Figure 6C:
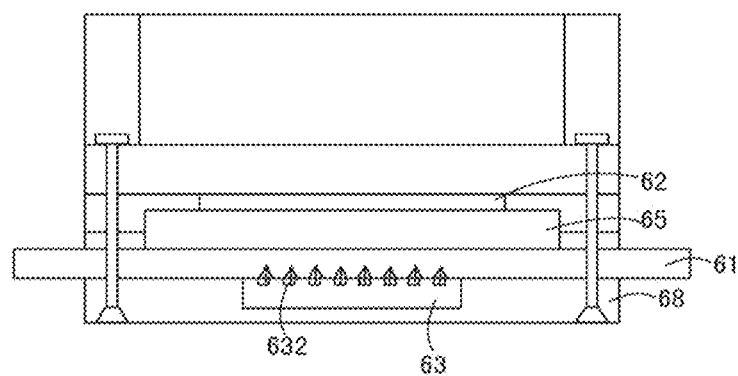

The power converting module 63 includes an input and an output. The input of the power converting module 63 may be a power input or a signal input of the power converting module 63, or including both. As shown in FIG. 6B, input pins 631 provided on the upper surface of the power converting module 63 electrically connect the circuit board 61. The power input and/or signal input may be directly transmitted to the power converting module 63 from the circuit board 61, as shown by arrows in FIG. 6B. As shown in FIG. 6C, output pins 632 provided on the upper surface of the power converting module 63 electrically connect the circuit board 61, and they may further connect the chip 62 through the circuit board 61 and the socket 65. A power output and/or signal output may be transmitted from the power converting module 63 to the chip 62 through the circuit board 61 and the socket 65 in sequence. However, the present disclosure is not limited to this. For example, in some embodiments, the socket may be omitted. Combining with FIG. 6C, a connecting mode between the pins 631 and 632 and the circuit board 61 may be welding or pressing.

Figure 6D:
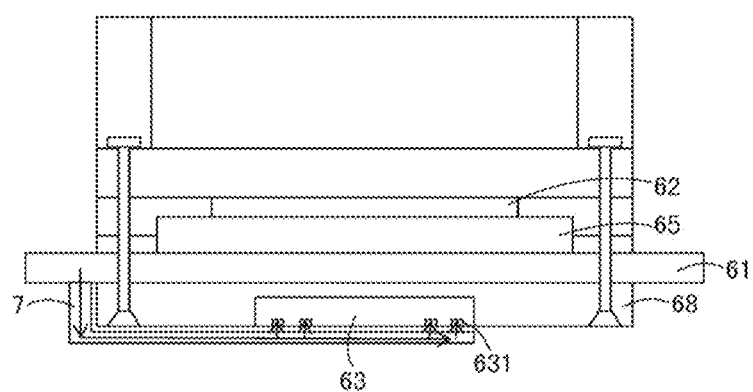
FIGS. 6D-6G are schematic diagrams of an assembly structure for providing power for a chip in which a power converting module is partly buried in a back plate and contacts a circuit board through a connector, according to an embodiment of the present disclosure.
Figure 6E:
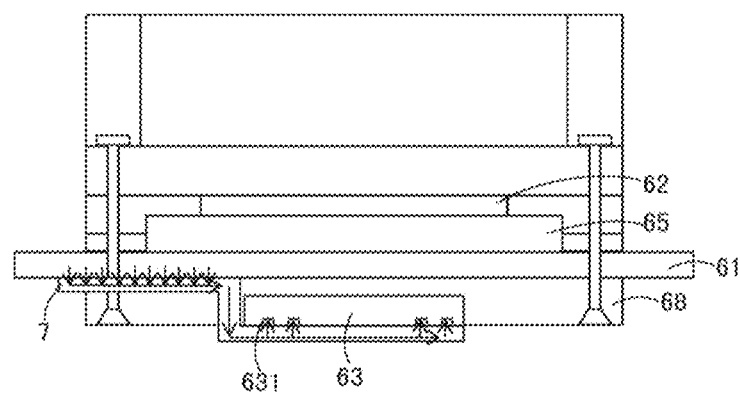
Figure 6F:
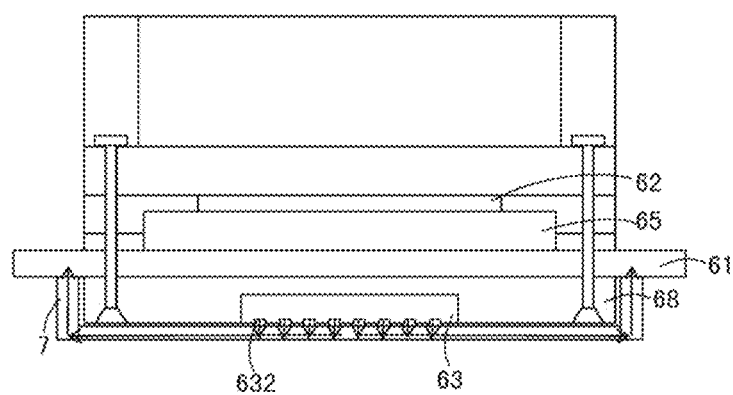
Figure 6G:
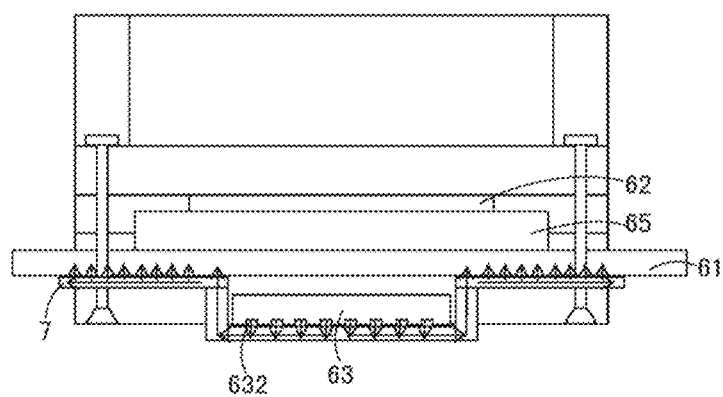

FIG. 6D is a schematic diagram of an assembly structure for providing power for a chip of another embodiment of the present disclosure. It mainly differs from the embodiments as shown in FIGS. 6A-6C in that, the power converting module 63 is partly buried in the back plate 68, a lower surface of the power converting module 63 is exposed from the back plate 68, and the lower surface of the power converting module 63 directly contacts a connector 7. The connector 7 is located below the back plate 68, and may stride over the back plate 68 to connect the circuit board 61 with the power converting module 63. However, the present disclosure is not limited to this, as long as the power converting module 63 may be electrically connected with the circuit board 61 or the chip 62. Wherein the input pins 631 provided on the lower surface of the power converting module 63 may be connected with the connector 7, and electrically connected with the circuit board 61 through the connector 7. The power input and/or signal input may be transmitted from the circuit board 61 to the power converting module 63 through the connector 7, as shown by arrows in FIG. 6D. As shown in FIG. 6E, the connector 7 may be partly located between the back plate 68 and the circuit board 61. The power input and/or signal input in this structure may be shown by arrows in FIG. 6E. The present disclosure is not limited to this, and a structure and a style of the connector 7 may be various. A connecting mode between the power converting module 63 and the connector 7 may be welding or pressing, etc. A connecting mode between the circuit board 61 and the connector 7 may be welding or pressing, etc. As shown in FIG. 6E, a connection between the connector 7 and the circuit board 61 may be by welding. The back plate 68 may be used to press the connector 7 on the circuit board 61 and make pins (not shown in FIG. 6E) between them connected. A position at which the connector 7 connects the circuit board 61 may be located on one side or a plurality of sides of the power converting module 63. The power output and/or signal output between the power converting module 63 and the circuit board 61 may be transmitted from the power converting module 63 through the pins 632 to the circuit board 61 via the connector 7, as shown by arrows in FIGS. 6F-6G. In one embodiment, the connector 7 may partly penetrate through the back plate 68, but the present disclosure is not limited to this. In one embodiment, the connector 7 may be designed as a configuration or structure assisting heat dissipation. For example, the connector 7 itself may be made of heat conductive material. Furthermore, a heat sink (not shown) may be provided to contact the connector 7 for heat dissipation. The above mentioned back plate and/or connector can be called as a connection component.

Figure 6H:
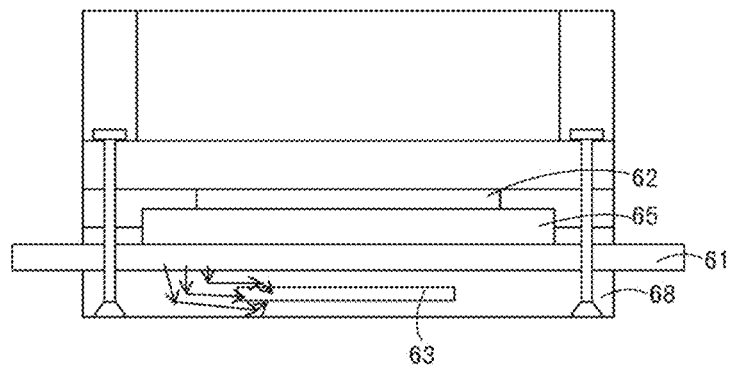
FIGS. 6H-6I are schematic diagrams of an assembly structure for providing power for a chip in which a power converting module is entirely buried in a back plate, according to a further embodiment of the present disclosure.
Figure 6I:
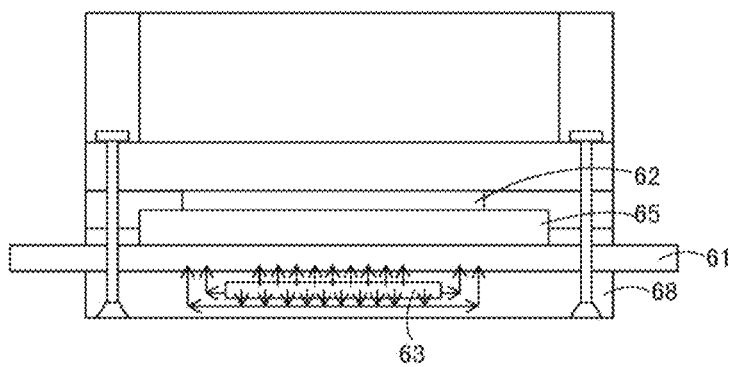

FIG. 6H is a schematic diagram of an assembly structure for providing power for a chip of a further embodiment of the present disclosure. It mainly differs from the embodiments as shown in FIGS. 6A-6E where the power converting module 63 is partly buried in the back plate 68 in that, in the present embodiment, the power converting module 63 is entirely buried in the back plate 68. An Input of the power converting module 63 may connect the circuit board 61 through the back plate 68. Power and/or signals are transmitted from the circuit board 61 to the back plate 68, and then transmitted to the power converting module 63 through the back plate 68. Connections of the power input and/or signal input between the power converting module 63 and the back plate may be on a side surface, an upper surface or a lower surface of the power converting module 63, or may be on a plurality of surfaces, which is shown by the arrows in FIG. 6H. As shown in FIG. 6I, an output of the power converting module 63 may connect the chip 62 through the back plate 68. Power and/or signals are transmitted from the power converting module 63 to the back plate 68, and then transmitted to the circuit board 61, the socket 65 and the chip 22 through the back plate 68 in sequence. However, the present disclosure is not limited to this. In some embodiments, the socket may be omitted. Connections of the power output and/or signal output between the power converting module 63 and the back plate 68 may be on a side surface, an upper surface or a lower surface of the power converting module 63, or may be on a plurality of surfaces, which is shown by the arrows in FIG. 6I. The power converting module 63 and the back plate 68 may be integrated into an undetachable entirety, and at this time, the connections between the power converting module 63 and the back plate 68 may be realized via conductors inside. The power converting module 63 and the back plate 68 may be detachable components. A connecting mode between the power converting module 63 and the back plate 68 may be welding or pressing, etc.

Figure 7A:
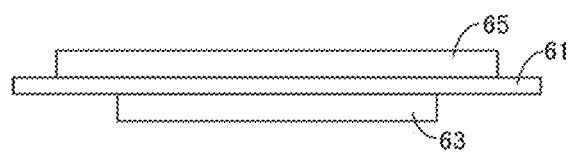
FIGS. 7A-7C are schematic diagrams of a distribution of pins between a power converting module and a circuit board in an assembly structure, according to an embodiment of the present disclosure.
Figure 7B:
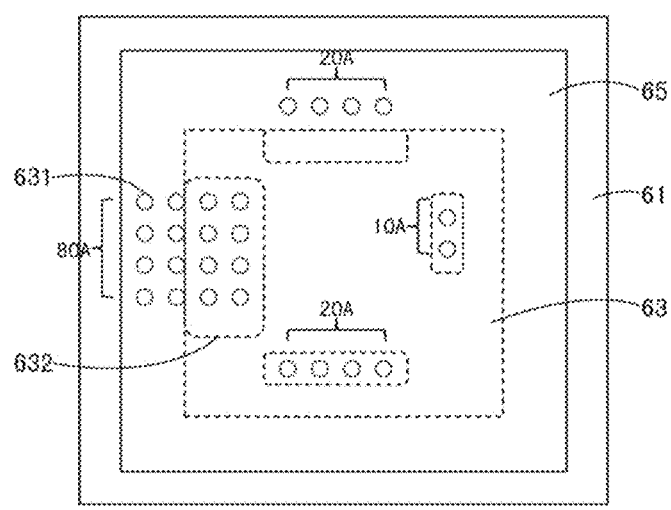

An arrangement of the output pins 632 of the power converting module 63 may be determined according to corresponding pin positions of the chip 62, the socket 65 or the circuit board 61. For example, projections of the output pins 632 of the power converting module 63 and projections of the electrical energy input terminal of the chip in a direction perpendicular to the circuit board, are overlapped, to realize a shorter power and/or signal transmitting distance. FIGS. 7A and 7B are schematic diagrams of pin arrangements when the power converting module 63 directly connects the circuit board 61, wherein FIG. 7A is a side view and FIG. 7B is a plan view. The power input pins 631 of the socket 65 are denoted by dashed circles, which may be distributed in different regions of surfaces of the socket 65. Power received by respective regions may be different, which is denoted by current values in FIG. 7B. The power output pins 632 (denoted by dashed boxes in FIG. 7B) of the power converting module 63 may be arranged according to positions of the power input pins 631 of the socket, distributed on surfaces of the power converting module 63. Pins with different shapes, sizes, and/or materials may be used according to power demand of the regions they are located, to achieve an aim of reducing power transmission losses. The respective regions of surfaces of the power converting module 63 may have one or more pins. In the present embodiment, projections of the electrical energy input terminal of the chip and of the power output pins of the power converting module in a direction perpendicular to the circuit board, are overlapped, to further reduce current path length. However, the present disclosure is not limited to this.

Figure 7C:
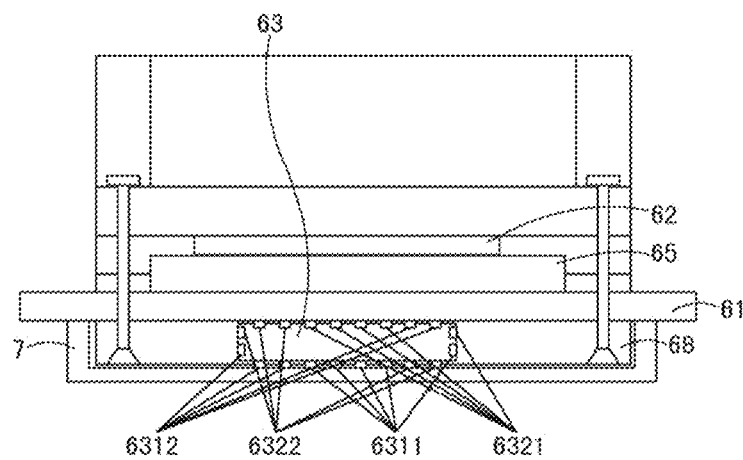

The input pins 631 and output pins 632 of the power converting module 63 may be located on the same surface (for example, a top surface or a bottom surface) or different surfaces of the power converting module 63. Alternatively, the input pins 631 and output pins 632 of the power converting module 63 may be partly located on the same surface and partly located on different surfaces of the power converting module 63. The input pins 631 and output pins 632 of the power converting module 63 may adopt the same connecting mode or different connecting modes to connect the circuit board 61 and the chip 62. For example, in FIG. 7C, a part of power input pins 6311 (for example, the input positive Vin+, the input negative Vin−, the auxiliary power supply and the like), a part of signal input pins 6312 (for example, the input voltage sampling, the input current sampling and the like), and a part of signal output pins 6322 (for example, the overcurrent warning signal, the module overheat warning signal and the like) of the power converting module 63 may be located on the bottom surface of the power converting module 63 and connected with the circuit board 61 through the connector 7. A part of power output pins 6321 (for example, the output positive Vo+, the output negative Vo− and the like), a part of signal output pins 6322 (for example, the input current monitoring signal, the output current monitoring signal and the like), and a part of signal input pins 6312 (for example, the terminal voltage sampling signal of the chip and the like) may be located on the top surface of the power converting module 63 and connected with the chip 62 through the circuit board 61 and the socket 65 in sequence. A part of power input pins 6311 (for example, the input positive Vin+, the input negative Vin−, the auxiliary power supply and the like), a part of power output pins 6321 (for example, the output positive Vo+, the output negative Vo− and the like), a part of signal input pins 6312 (for example, the digital communication input and the like) and a part of signal output pins 6322 (for example, the digital communication output and the like) may be located on the side surface of the power converting module 63 and connected with the back plate 68.

Figure 8A:
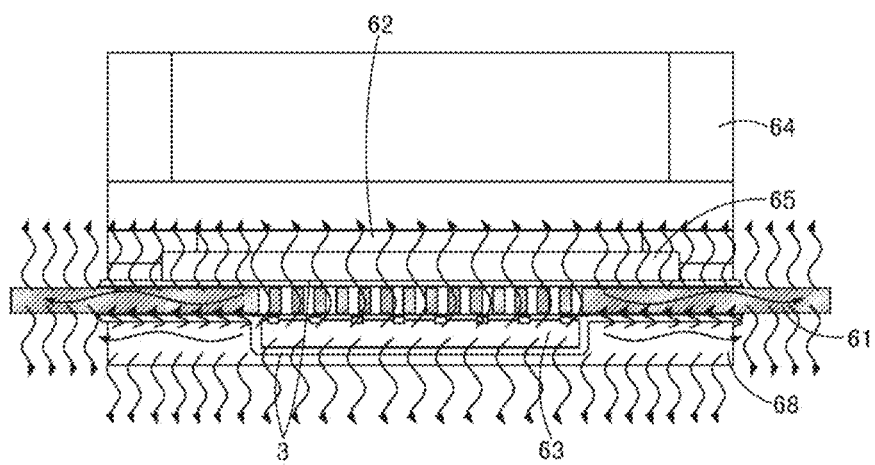
FIGS. 8A-8E are schematic diagrams of heat dissipation of an assembly structure for providing power for a chip of an embodiment of the present disclosure.
Figure 8B:
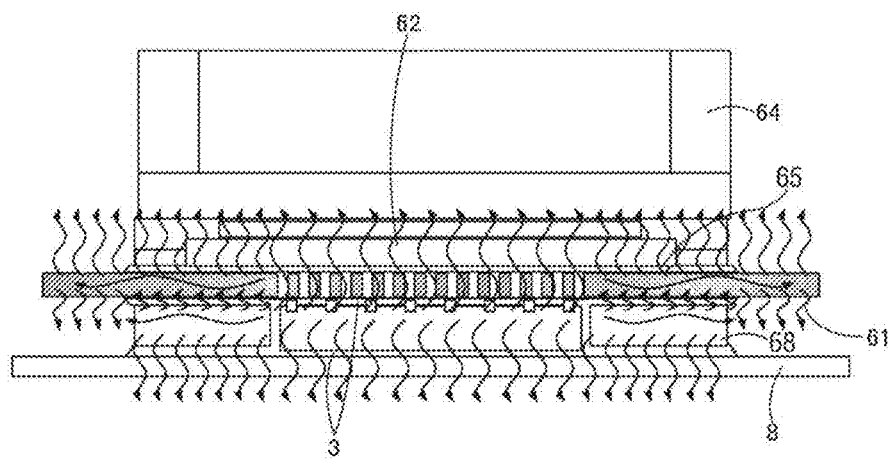
Figure 8C:
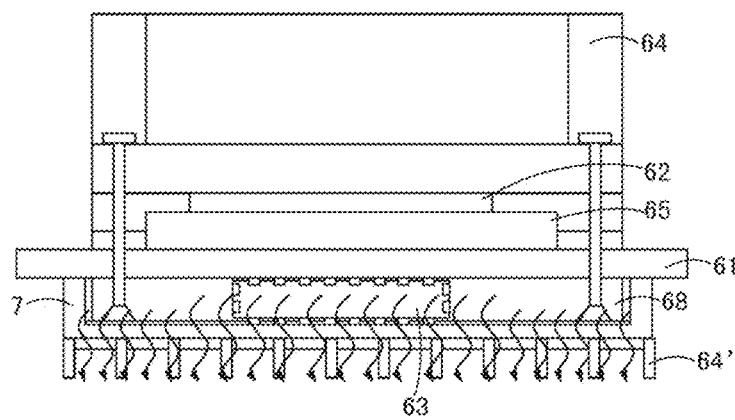
Figure 8D:
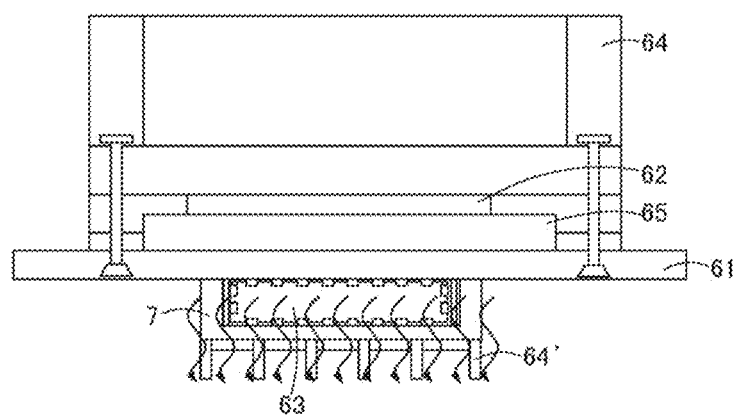
Figure 8E:
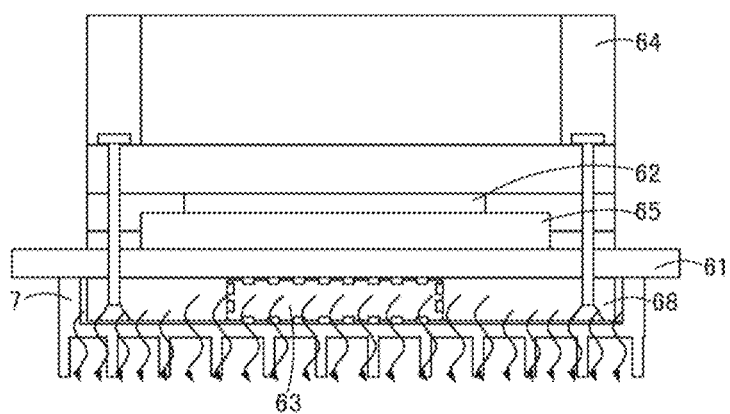

FIGS. 8A-8E are schematic diagrams of heat dissipation of the assembly structure for providing power for a chip of the above embodiments as shown in FIGS. 6A-6F. As shown in FIG. 8A, In order to conduct the heat of the power converting module 63 to the circuit board 61 and the back plate 68 more smoothly, heat conductive material 3 may be filled in gaps between the power converting module 63 and the circuit board 61, gaps between the power converting module 63 and the back plate 68, and gaps between the circuit board 61 and the back plate 68. As shown in FIG. 8B, heat of the power converting module 63 may be dissipated through a chassis 8 of the system. Heat conductive material 3 (for example, thermal conductive silicone or thermal pad and the like) may be filled in gaps between the power converting module 63 and the chassis 8, gaps between the power converting module 63 and the back plate 68, and gaps between the chassis 8 and the back plate 68. As shown in FIG. 8C, heat of the power converting module 63 may be dissipated through the connector 7, or may be dissipated through a heat sink 64' (a second heat sink) provided below the power converting module 63. The heat sink 64' may contact the connector, or may directly contact the power converting module 63. The present disclosure is not limited to this. The connector 7 and the heat sink 64' provided below the power converting module 63 may be separate components, or may be one component or may be molded as a whole, such as a structure as shown in FIG. 8E. For example, by applying a process such as stamping, milling and so on, on the connector 7, a wing shaped structure as shown in FIG. 8C is formed on a surface of the connector 7. The similar process may be adopted to deal with a structure of the heat sink 64' as shown in FIG. 8D. The present disclosure is not limited to this. The difference between FIGS. 8D and 8C mainly lies in that the back plate 68 is omitted in FIG. 8D.

Figure 9:
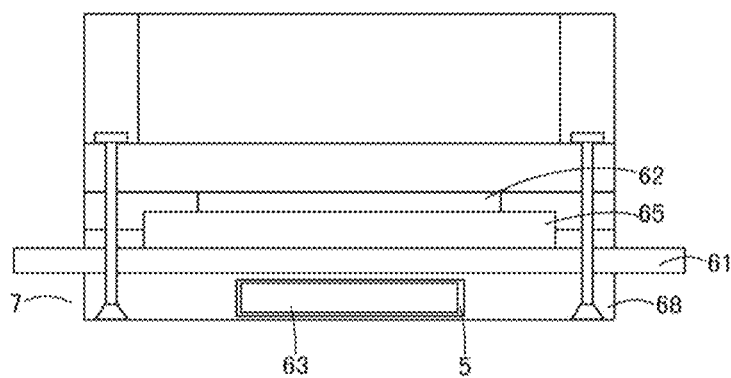
FIG. 9 is a schematic diagram of an assembly structure for providing power for a chip of an embodiment of the present disclosure which includes an electromagenetic shielding layer.

In order to prevent EMI, the electromagnetic shielding layer 5 may be installed around the power converting module 6, as shown in FIG. 9. If needed, the electromagnetic shielding layer 5 may be provided on one surface or a plurality of surfaces of the power converting module 63, wherein the electromagnetic shielding layer on any surface may cover the surface entirely (overall shielding) or cover the surface partially (shadow shielding). At least a part of the electromagnetic shielding layer may be located between the chip 62 and the power converting module 63, and vertically stacked with the power converting module 63 and the chip 62, to reduce or even eliminate mutual interference between the chip 62 and the power converting module 63. Material of the shielding layer may be metal material (such as copper, aluminum and the like) or magnetic material (such as soft magnetic material) correspondingly. The shielding layer may be installed as a separate component, or may be integrated together with the power converting module 63 and/or the back plate 68, or may be partly separated and partly integrated with other components. If the back plate 68 is entirely or locally made of metal material, the whole or a part of the metal material of the back plate 68 may be used to realize a function of electromagnetic shielding.

Figure 10:
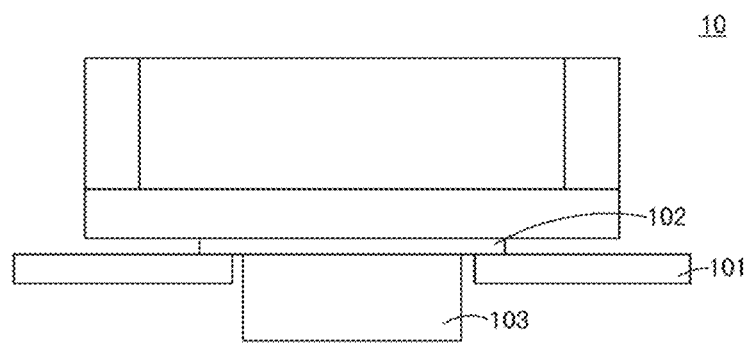
FIG. 10 is a schematic diagram of an assembly structure for providing power for a chip of an embodiment of the present disclosure in which a power converting module penetrates through a circuit board.

FIG. 10 is a schematic diagram of stacking of an assembly structure 10 for providing power for a chip according to another embodiment of the present disclosure. The power converting module 103 (DC/DC) and the chip 102 is stacked in a vertical direction. The power converting module 103 penetrates through an opening in a circuit board 101 and electrically connects the chip 102.

Figure 10A:
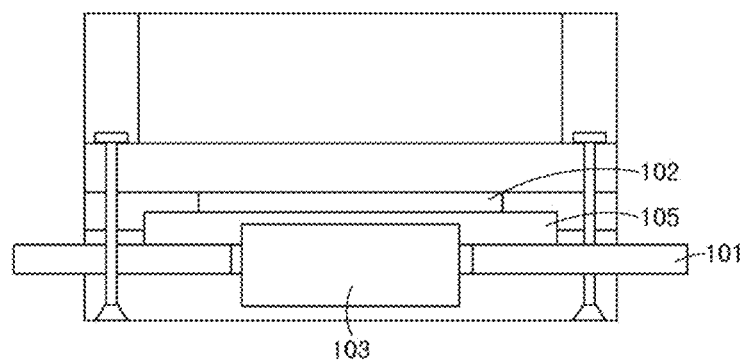
FIG. 10A is a schematic diagram of an assembly structure for providing power for a chip of an embodiment of the present disclosure in which a power converting module penetrates through a circuit board and is partly buried in a socket.
Figure 10B:
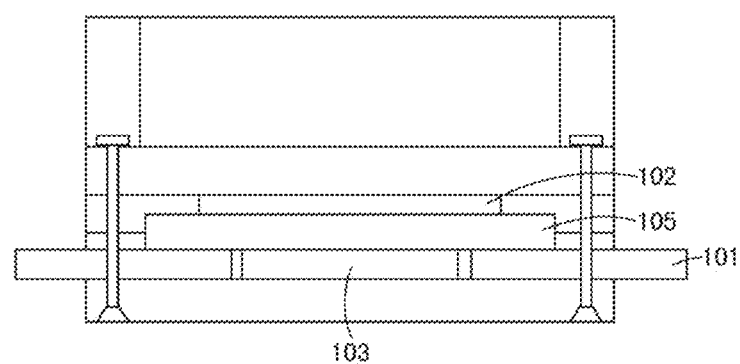
FIG. 10B is a schematic diagram of an assembly structure for providing power for a chip in which a power converting module and a circuit board are separately provided.
Figure 10C:
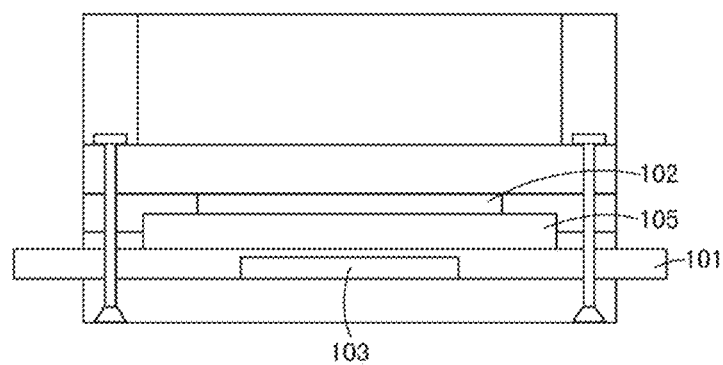
FIG. 10C is a schematic diagram of an assembly structure for providing power for a chip in which a power converting module and a circuit board are integrated into an entirety.

FIG. 10A is a schematic diagram of stacking of an assembly structure for providing power for a chip according to another embodiment of the present disclosure. It mainly differs from the assembly structure for providing power for a chip as shown in FIG. 10 in that, it further includes a socket 105, and the power converting module 103 may be partly buried in the socket 105. As shown in FIG. 10B, when thickness of the power converting module 103 is less than or equal to that of the circuit board 101, the power converting module 103 may only penetrate through the circuit board 101 and may be not buried in the socket 105. The power converting module 103 and the circuit board 101 in FIGS. 10 and 10A may be separate elements and may be assembled together later. As shown in FIG. 10C, molding technology or embedded technology used in packaging may be adopted to integrate the power converting module 103 and the circuit board 101 into an undetachable component. In one embodiment, the power converting module 103 may be partly buried in the circuit board 11.

Figure 11:
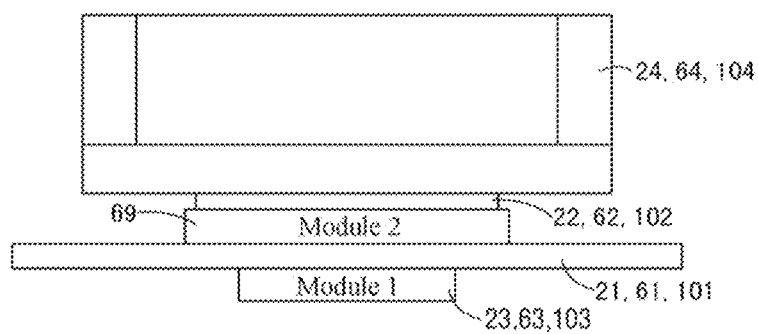
FIG. 11 is a schematic diagram of an assembly structure for providing power for a chip of an embodiment of the present disclosure in which a power converting module includes two power converting modules.

As shown in FIG. 11, the amount of the power converting module may be more than one, for example, two. These power converting modules may be located on the same side or different sides of the circuit board, or partly buried in the circuit board. The present disclosure is not limited to this.

Figure 11A:
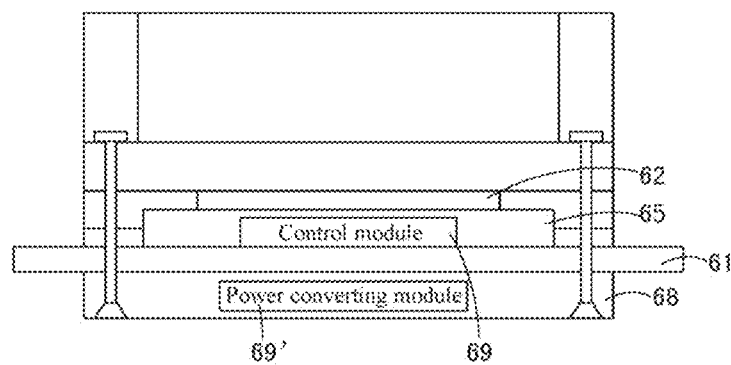
FIG. 11A is a schematic diagram of an assembly structure for providing power for a chip of another embodiment of the present disclosure in which a power converting module includes a control module and a converting module separately provided.

The above embodiments describe the modes that the power converting modules 23, 63 and 103, the chips 22, 62 and 102 and the circuit boards 21, 61 and 101 are vertically stacked. Here, the power converting modules 23, 63 and 103 may contain power converting modules (or referred to as main circuit modules). Topological structures of a converting circuit of the power converting modules may have many choices, for example, a PWM (Pulse Width Modulation) type circuit (such as Buck, flyback, forward and the like). It may be a resonant type circuit (such as LLC (Inductor, Inductor and Capacitor) and the like) and so on. A control circuit that controls the converting circuit may be integrated into the power converting modules 23, 63 and 103, or it may be separated out to form a separate control module. As shown in FIG. 11A, the control module 69 (or referred to as a control circuit module) may be vertically stacked with the power converting module 69', the chip 62 and the circuit board 61. The positions of the power converting module 69' and the control module 69 may be interchanged. The control module 69 and the power converting module 69' may be on the same side of the circuit board, or may be partly buried in the circuit board. The present disclosure is not limited to this. The control module 69 may not be stacked with the power converting module 69' and the chip 62 and the like, and may be disposed on one side of the circuit board 61. Here, the position arrangements of the respective power converting modules 23, 63 and 103 described in the above embodiments are all applicable to the power converting module 69' and/or the control module 69. The power converting module 69', the control module 69 and the chip 62 (for example, a CPU) may transmit signals through wireless communication or a wired way, etc. For example, connection and communication may be performed via signal lines (not shown in FIG. 11A) on the circuit board 61 or the socket 65. The power converting modules 23, 63 and 103 may be a DC/DC module, but the present disclosure is not limited to this.

Figure 11B:
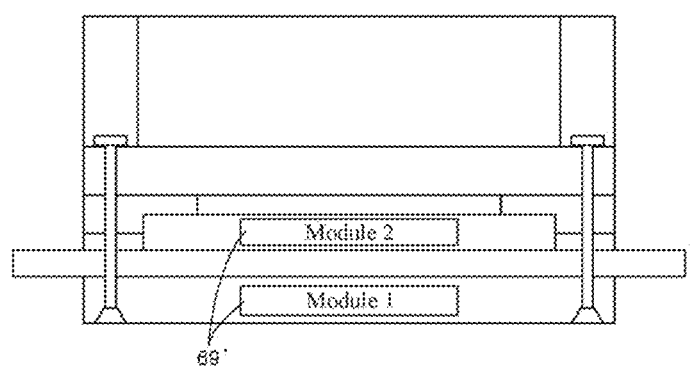
FIG. 11B is a schematic diagram of an assembly structure for providing power for a chip of another embodiment of the present disclosure which includes two power converting modules.

As shown in FIG. 11B, a first module (module 1) and a second module (module 2) may be the power converting module 69', or may be the power converting modules 23, 63 and 103. The first module and the second module (module 2) may be input-series, or in parallel, or cascading or a combination of these connecting modes. The present disclosure is not limited to this. For example, input-series-output-parallel or input-parallel-output-parallel may be adopted. The amount of the power converting modules and/or the power converting modules may be more than one. A plurality of modules may supply power for the chips, or other loads, or for the chips and other loads at the same time. A part or all of the plurality of modules may locate on the same side of the main board with the chips, or locate on the other sides of the main board, or penetrate through the opening in the main board, or be buried into the main board, or adopt any combination of the above ways. Connecting modes between the input and the output of any separate module among the plurality of modules and the system, arrangement and implementation modes of pins of the modules, implementation modes of heat dissipation and anti-interference of the modules may adopt one or more modes described in the above embodiments.

The combined structures of the above embodiments may contain a socket, to facilitate the chip to perform connections of other signals with the circuit board. However, in fact, by the structure that the power converting module and the CPU are stacked, the CPU may perform the connections of other signals with the circuit board directly through the power converting module. As shown in FIG. 11, in the assembled structure, the two modules are located on two opposite sides of the main board respectively. The CPUs 22, 62 and 102 are provided on the second module (module 2). The heat sinks 24, 64 and 104 are provided on the CPUs 22, 62 and 102 to dissipate heat from the CPUs, or the heat sinks may be provided below the first module (module 1). The arrangement mode of pins of the second module (module 2) may adopt any one of the above embodiments. In one embodiment, the CPU may receive power source signal of the first module through pins of the second module, and provide some feedback control signals to the first module. In above embodiments, signal exchange between the CPU and other chips on the main board may be performed after the socket connects the circuit board, but the present disclosure is not limited thereto. In FIG. 11, the signal exchange may be performed by traces on the surfaces of the second module or inside the second module connecting the main boards 21, 61 and 101. The second module may not only serve as a converting module to provide power source for the CPU, but also serve as a connecting structure to electrically connect the CPU and the main board. The present disclosure is not limited to this.

In one embodiment, the circuit board, the CPU and the power converting module (such as a DC/DC converter) may form an assembly structure in a stacking sequence. For example, the stacking sequence may be the CPU on the DC/DC converter, then the DC/DC converter on the circuit board; or the CPU on the circuit board, then the circuit board on the DC/DC converter; or the CPU on the circuit board and the DC/DC converter being at least partly buried in the circuit board. The present disclosure is not limited to this.

Figure 12A:
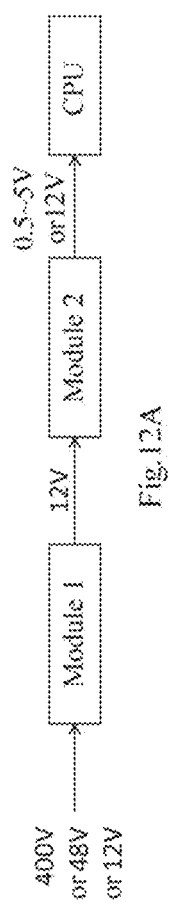
FIGS. 12A-12G are schematic diagrams of functions and mutual connection relationships between power converting modules.
Figure 12B:
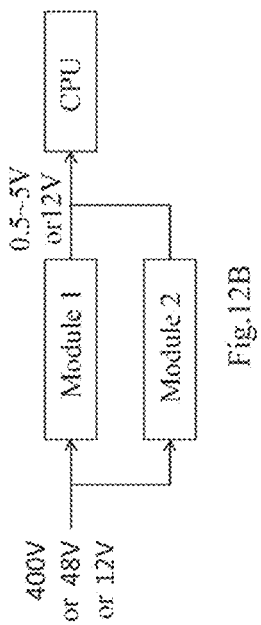
Figure 12C:
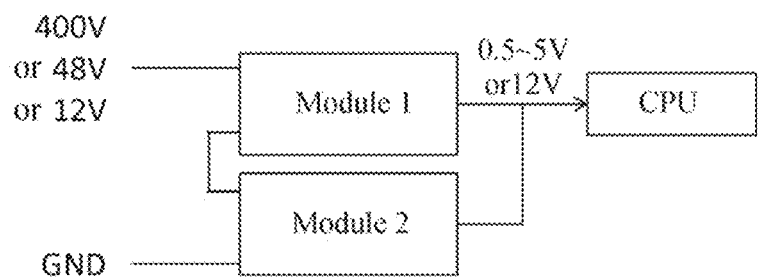
Figure 12D:
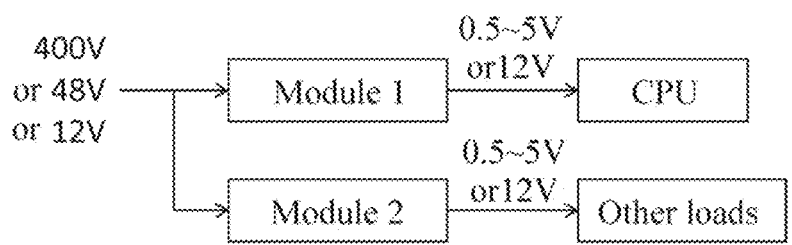
Figure 12E:
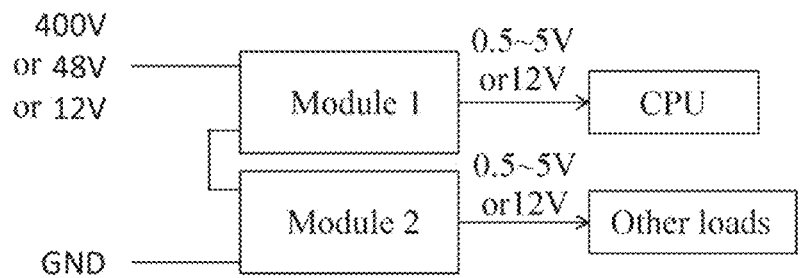
Figure 12F:
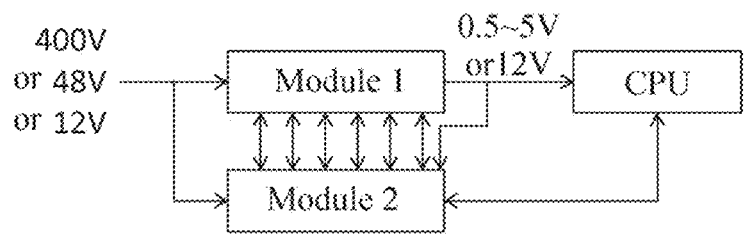
Figure 12G:
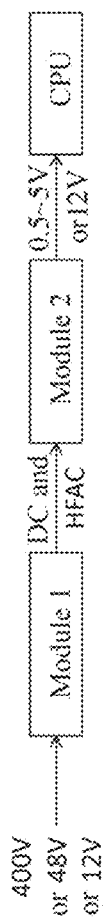

FIGS. 12A-12G are schematic diagrams of several possible functions and mutual connection relationships between two modules. Two modules in FIG. 12A constitute a two-stage power supply mode. An input voltage of the module 1 is, for example, 400V, 48V or 12V, and an output voltage of the module 2 is, for example, 12V or a range of 0.5V-5V. The present disclosure is not limited to this. Inputs and outputs of two modules in FIG. 12B are in parallel. Two power source modules in FIG. 12C are in the connection relationship of input-series-output-parallel, that is, their inputs are in series and their outputs are in parallel. Input ends of two power source modules in FIG. 12D are in parallel, and their outputs supply power for different loads respectively. Input ends of two power source modules in FIG. 12E are in series, and their outputs supply power for different loads respectively. A second module (module 2) and a first module (module 1) in FIG. 12F may communicate with each other. A first module in FIG. 12G may be a converting module, whose output is a power with a DC component and a high frequency AC (HFAC) component at the same time. A second module in FIG. 12G may be a filter module, which filters the HFAC component output by the first module and transmits the DC power to the chip (CPU).

A numerical value of an input voltage or output voltage of the power source module or a combination of the power source module may be understood not only as a fixed value, but also as a range containing a given value. For example, an input voltage 400V may be understood not only as the input voltage being 400V, but also as a range containing 400V (for example, 200V-50V). Similarly, an input voltage 48V may be understood as a range of 18V-72V, and an input voltage 12V may be understood as a range of 5V-15V. The present disclosure is not limited to this. An output voltage, for example, 0.5V-5V, may be understood as that the output voltage is a steady voltage which may be adjusted as needed. The present disclosure is not limited to this. A type of the power source module or a combination of the power source module may have many choices, for example, converting 400V to 48V, converting 400V to 12V, converting 400V to 0.5-5V, converting 48V to 12V, converting 48V to 0.5-5V, converting 12V to 0.5-5V and the like. The present disclosure is not limited to this.

An electronic device according to one embodiment of the present disclosure, including: the assembly structure described above. Wherein the electronic device is, for example, a server or a computer.

Exemplary implementations of the present disclosure have been specifically shown and described above. It should be understood that the present disclosure is not limited to the disclosed implementations. Instead, the present disclosure intends to cover various modifications and equivalent replacements within the scope of the appended claims.

What is claimed is:

1. An assembly structure for providing power for a chip, comprising:
    a circuit board, configured to provide a first electrical energy;
    a chip;
    a power converting module, configured to electrically connect the circuit board and the chip, convert the first electrical energy to a second electrical energy, and supply the second electrical energy to the chip, wherein the chip, the circuit board and the power converting module are stacked; and
    a connection component, configured to electrically connect the circuit board and the power converting module;
    wherein the power converting module and the chip are located on two opposite sides of the circuit board;
    the connection component comprises a connector electrically connecting the circuit board and the power converting module, wherein the connector and the chip are disposed on two opposite sides of the circuit board; and
    the connection component further comprises a back plate, wherein the back plate and the chip are disposed on two opposite sides of the circuit board.

2. The assembly structure for providing power for a chip according to claim 1, wherein a connection point of the connector and the circuit board is outside a projection of the chip on the circuit board.

3. The assembly structure for providing power for a chip according to claim 1, wherein the power converting module is partly buried in the back plate, and a surface of the power converting module is exposed from the back plate and directly contacts the connector.

4. The assembly structure for providing power for a chip according to claim 3, wherein the connector extends along an outer surface of the back plate, to electrically connect the circuit board and the power converting module.

5. The assembly structure for providing power for a chip according to claim 4, wherein the connector extends along a lateral surface of the back plate and a surface of the back plate away from the circuit board.

6. The assembly structure for providing power for a chip according to claim 3, wherein a part of the connector is located between the back plate and the circuit board, to electrically connect the circuit board and the power converting module.

7. The assembly structure for providing power for a chip according to claim 1, wherein connection points of the connector and the circuit board are on one side or more sides of a projection of the power converting module on the circuit board.

8. The assembly structure for providing power for a chip according to claim 1, wherein the connector is configured to transmit input power of the power converting module from the circuit board to the power converting module.

9. The assembly structure for providing power for a chip according to claim 1, wherein the connector is configured to transmit output power of the power converting module from the power converting module to the circuit board.

10. The assembly structure for providing power for a chip according to claim 1, wherein the connector is formed of heat conductive material.

11. The assembly structure for providing power for a chip according to claim 1, further comprising:
    a heat sink, disposed on the connector.

12. An assembly structure for providing power for a chip, comprising:
    a circuit board, configured to provide a first electrical energy;
    a chip;
    a power converting module, configured to electrically connect the circuit board and the chip, convert the first electrical energy to a second electrical energy, and supply the second electrical energy to the chip, wherein the chip, the circuit board and the power converting module are stacked; and
    a connection component, configured to electrically connect the circuit board and the power converting module;
    wherein the power converting module and the chip are located on two opposite sides of the circuit board;
    the connection component comprises a connector electrically connecting the circuit board and the power converting module, wherein the connector and the chip are disposed on two opposite sides of the circuit board; and
    a surface of the connector is formed with a wing shaped structure.

13. An assembly structure for providing power for a chip, comprising:
    a circuit board, configured to provide a first electrical energy;
    a chip;
    a power converting module, configured to electrically connect the circuit board and the chip, convert the first electrical energy to a second electrical energy, and supply the second electrical energy to the chip, wherein the chip, the circuit board and the power converting module are stacked; and
    a connection component, configured to electrically connect the circuit board and the power converting module;
    wherein the power converting module and the chip are located on two opposite sides of the circuit board; and
    the connection component comprises:
    a back plate, electrically connecting the circuit board and the power converting module, wherein the back plate and the chip are disposed on two opposite sides of the circuit board.

* * * * *